United States Patent [19]

de Waard

[11] 4,323,856
[45] Apr. 6, 1982

[54] INJECTION LASER

[75] Inventor: Peter J. de Waard, Eindhoven, Netherlands

[73] Assignee: U.S. Philips Corporation, New York, N.Y.

[21] Appl. No.: 921,797

[22] Filed: Jul. 3, 1978

Related U.S. Application Data

[63] Continuation of Ser. No. 764,351, Jan. 31, 1977, abandoned.

[30] Foreign Application Priority Data

Jul. 2, 1976 [NL] Netherlands .......................... 7607299

[51] Int. Cl.³ .............................................. H01S 3/19
[52] U.S. Cl. ........................................ 372/46; 357/17
[58] Field of Search ................ 331/94.5 H; 357/16–18

[56] References Cited

U.S. PATENT DOCUMENTS 3,983,510  9/1976  Hayashi et al. ................ 331/94.5 H

FOREIGN PATENT DOCUMENTS 51-100687  9/1976  Japan .............................. 331/94.5 H

OTHER PUBLICATIONS

L. A. D'Asaro et al., "Junction Lasers", *Physics Today*, Mar. 1971, vol. 24, No. 3, pp. 42–48.

*Primary Examiner*—James W. Davie
*Attorney, Agent, or Firm*—Thomas A. Briody; Robert T. Mayer; Steven R. Biren

[57] ABSTRACT

An injection laser includes two substantially parallel mirror side faces and a substantially stripe-shaped contact member having a comparatively large width. The stripe-shaped contact member has a shape and disposition with respect to the mirrors such that laser action can be obtained only in a comparatively narrow stripe of the active layer. For example, the contact member may be arranged to extend obliquely with respect to the mirrors instead of at right angles thereto.

17 Claims, 14 Drawing Figures

INJECTION LASER

This is a division of application Ser. No. 764,351, filed Jan. 31, 1977, now abandoned.

The invention relates to an injection laser comprising a semiconductor body having two substantially parallel side faces forming the mirrors of the laser, said semiconductor body comprising a p-n junction extending transversely to the mirror side faces and an active laser layer situated near said p-n junction, and a respective contact member arranged on each side of the p-n junction, said contact members each bridging the distance between the mirror side faces substantially entirely, a first of said contact members being situated closer to said p-n junction than the second, the portion of the p-n junction at which spontaneous luminescence occurs when a current approximately equal to the threshold current which is necessary for the occurrence of stimulated emission is passed from one contact member to the other through the semiconductor body having the shape of a stripe extending from one mirror side face to the other.

Such an injection laser is known, for example, from Netherlands patent application No. 73 03 449 laid open to public inspection on Sept. 17, 1973, and corresponding to British Specification No. 1,419,695. Said stripe lasers usually have a stripe-shaped contact member—usually the contact member which is situated nearest to the p-n junction and the active laser layer—which determines that portion of the active laser layer in which laser action can occur. Said stripe-shaped contact member may be formed as an oxide stripe or, for example, as a mesa stripe, a buried mesa stripe, a proton-bombardment stripe or a stripe bounded by implantation of oxygen ions. These and other known stripe-shaped contact members have in common with one another that a narrow width is defined parallel to the p-n junction and the active layer for the cross-section of the electric current flow through the body and which therefore at least partly determines the size of portion of the p-n junction through which current will flow under operating conditions. This cross-section may be equal to the current-carrying portion of the p-n junction and the active layer, as for example in mesa constructions, or smaller, as for example in the oxide stripe arrangement, in which the contact member is formed by a metal electrode which is connected to the semiconductor body in a stripe-shaped aperture in an insulating layer present on the semiconductor body. In the oxide stripe arrangement current spreading will occur from the aperture towards the p-n junction so that the current-carrying portion of the p-n junction will be wider than the current-path defining cross-section of the contact member which in this case will coincide with the aperture in the insulating layer.

It is of importance in several applications to keep the current-carrying portion of the active laser-layer small and to limit it in the direction parallel both to the active layer and to the mirror side faces. This is concerned with the lateral limitation of the part of the active layer in which laser action may occur or, i.e. the width of the stripe-shaped portion of the active layer in which the required inversion is obtained. The width of the lasing region in the active layer is often greater than that of the current-carrying portion of the active layer. Since the charge carriers injected into the active layer are also often confined to the active layer, diffusion of charge carriers occurs within the layer as a result of the concentration gradient at the edges of the current-carrying portion. Thus outside the current-carrying portion inversion can still occur in the active layer at a distance which is of the order of the diffusion length of the injected charge carriers.

The width of the stripe-shaped portion in which inversion occurs will tend to determine the mode or modes in which the laser will operate. When the laser action is to be restricted to a single spot, as is desired, for example, for optical communication and for video and audio longplay systems, the width will have to be made sufficiently small so that only the fundamental mode will occur. If it were desired to reduce the width of said single laser spot parallel to the active layer still further, the stripe-shaped portion in which inversion occurs would have to be made even narrower. In practice the desired widths are at the boundary of what is achievable with existing technology. This requires complicated manufacturing processes which consequently have a comparatively low yield. For example, the above-mentioned Netherlands patent application No. 73 03 449, which corresponds to British Specification No. 1,419,695 describes the use of a stripe-shaped contact member in a device which includes, in addition to a metal electrode situated in an aperture in an insulating layer, two further semiconductor layers present between the metal electrode and the active layer, and in which the current-path defining cross-section for the contact member is realized by selectively etching said two semiconductor layers. Notably, use is made of the technique of underetching the second semiconductor layer below the first layer which latter masks a narrow stripe of the second layer during the etching process, in order to achieve the desired narrow width.

It is an object of the invention to provide a stripe injection laser which provides a single spot, and so operates in the fundamental mode, and which can be manufactured comparatively easily and with comparatively high yields. It is based inter alia on the recognition of the fact that by a suitable choice of the shape of the contact member and the arrangement thereof relative to the mirror side faces with a comparatively wide current-carrying stripe of the p-n junction and the active laser layer, the laser action can nevertheless be restricted to a comparatively narrow stripe between the mirror side faces.

An injection laser of the kind mentioned above is characterized according to the invention in that the geometry of the first contact member is such that only one rectangular stripe-shaped region which is as wide as possible and extends from one mirror side face to the other can be accommodated in the stripe-shaped portion of the p-n junction whose longitudinal side boundaries are spaced a distance b from each other measured parallel to said mirror side faces, which distance b is such that the local intensity of the said spontaneous emission occurring between said longitudinal side boundaries is at least approximately 0.3 part of the maximum value of the local intensity of said spontaneous emission, the width of said rectangular stripe-shaped region being at most equal to the distance b minus one sixtieth part of the distance between the mirror side faces and is such that in operation a single laser spot is generated.

The use of the invention considerably facilitates the manufacture of lasers operating in the fundamental transversal mode. With the invention it is no longer necessary for the technology used during manufacture to be employed at its ultimate limits. In particular, photolithographic operations and etching processes need no longer be applied to obtain the smallest possible dimensions since a comparatively large, and in practice readily realizable, dimension can be chosen for the width of the contact member.

The width of the rectangular stripe-like portion is preferably at most equal to 6 μm. In practical cases there will then be a sufficiently high probability that only a single spot will occur and the laser will operate in the fundamental transversal mode.

An important preferred embodiment of the injection laser according to the invention is characterized in that the semiconductor body comprises a semiconductor substrate which extends between the p-n junction and the second contact member, the p-n junction and the active layer extending laterally throughout the width of the semiconductor substrate in a direction parallel to the mirror side faces.

Consequently, in this embodiment the p-n junction and the active layer are wider than the current carrying portion thereof. The portion in which spontaneous emission is obtained does not extend up to an edge of the p-n junction or of the active layer as is the case in some mesa and buried mesa stripe lasers. This has important technological advantages. In order to restrict the p-n junction and the active layer laterally to a narrow stripe in which laser action can occur in the prior art, extra operations are often necessary during manufacture, such as etching or a bombardment with, for example, protons or oxygen ions. More important however, is that radiationless recombination of charge carriers can easily occur at the edge of the p-n junction and the active layer and, in addition, there is often a comparatively large difference between the indices of refraction of the materials on either side of the boundary edge. Both effects make the edges of the p-n junction and of the active layer critical regions from a point of view of manufacture. Losses which adversely affect a good laser action can easily occur in such edge regions. The yield in the manufacture of such lasers will hence be lower than the yield of lasers having a continuous active layer. The use of the invention enables difficulties associated with said critical boundary regions of the active layer to be avoided while enabling lasers to be manufactured which generate only a single laser spot.

A further preferred embodiment of the injection laser according to the invention is characterized in that the first contact member comprises an electrode of conductive material which is separated from the semiconductor laser body by a barrier layer and is connected electrically to the laser body in a stripe-shaped aperture in the barrier layer, the width of the stripe-shaped aperture being at least approximately 5 μm.

The barrier layer may be a semiconductor layer which forms a rectifying junction with the semiconductor laser body which during operation is reverse biased, but will usually be formed by a layer of insulating material, for example an oxide layer.

In a simple preferred embodiment the stripe-shaped aperture in the barrier layer has two substantially parallel straight sides or edges which extend substantially from one mirror side face to the other and which are inclined at an angle of at least 1 and preferably 2 or more degrees to the normal to both mirror side faces. The advantage of this embodiment is that, after having provided a semiconductor crystal slice with one or more stripe-shaped contact members, one or more lasers can be obtained therefrom in which the width of said rectangular stripe-shaped lasing region and consequently the width of the laser spot can be brought to the desired value by correspondingly selecting the length of the laser. This length is fixed after providing the contact members by an operation in which the semiconductor body is cleft along a previously determined crystal plane to form the mirror side faces.

The stripe-shaped aperture in the barrier layer is preferably arranged to be oblique so that the perpendicular projections of the respective ends of the stripe-shaped aperture situated near the corresponding mirror side faces, onto a plane parallel to the mirror side faces, do not overlap each other in a direction parallel to the p-n junction but are situated entirely beside each other and at most touch each other.

The invention will be described in greater detail with reference to various embodiments and the accompanying drawing, in which.

The first exemplary embodiment relates to an injection laser having a double hetero junction and will now be described with reference to FIGS. 1, 2 and 3. The laser comprises a semiconductor body 1 (FIG. 1) having two substantially parallel side faces 2 and 3 (FIG. 2) forming the mirrors of the laser. Transversely to the mirror side faces 2 and 3 there extends a p-n junction 4 within the semiconductor body 1 near an active laser layer 5. Respective contact members 6 and 7, are present on each side of the p-n junction 4 and substantially entirely bridge the distance between the mirror side faces 2 and 3. A first contact member 6 is situated at a smaller distance from the p-n junction 4 than the second contact member 7.

Figure 1:
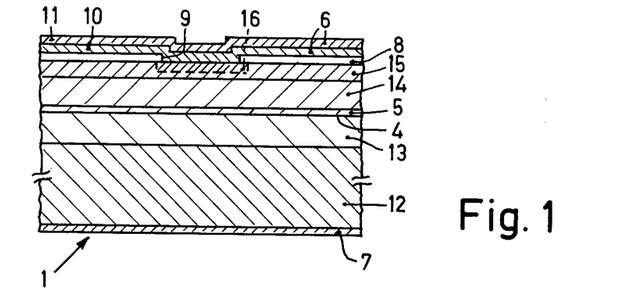
FIG. 1 is a diagrammatic cross-sectional view of a first embodiment.

The second contact member 7 is a conductor layer of 0.15 μm which extends over the whole of the lower surface of the semiconductor body 1, as shown in FIG. 1. On the oppositely located surface, the semiconductor body 1 is covered with an insulating layer 8 of, for example, silicon dioxide to a thickness of approximately 0.2 μm. A stripe-shaped aperture 9 extending from one mirror side face to the other is provided in the insulating layer 8. On the insulating layer 8 and in the aperture 9 there is provided a conductive layer 6 which in the present example is composed of a chromium layer 10 having a thickness of approximately 500 Å and a gold layer 11 having a thickness of approximately 2000 Å.

In the aperture 9 the conductive layer 6 forms a stripe-shaped conductive contact with the semiconductor body 1 so that upon passage of current from the conductive layer 6 to the conductive layer 7 the current-carrying portion of the active layer 5 and of the p-n junction 4 will also have a corresponding stripe shape. Thus, any spontaneous and/or stimulated emission generated across the p-n junction 4 by means of the electric current and the associated injection of charge carriers will also be restricted to a corresponding stripe-shaped region of the p-n junction 4 and the active layer 5. This stripe-shaped region in which emission can be generated extends, in a similar manner to the aperture 9, from one mirror side face 2 to the other mirror side face 3.

Other aspects of construction of the semiconductor body 1 of the laser are conventional. The semiconductor body comprises, in one practical example, a substrate 12 of n-type GaAs doped with Si to a concentration of approximately $10^8$ At/cm$^3$. Present on said substrate 12 is a layer 13 of $Al_xGa_{1-x}As$, where x is approximately 0.25. Said layer is a Sn-doped n-type layer with a thickness of approximately 3.2 $\mu$m, the Sn concentration being approximately $5 \times 10^{17}$ at/cm$^3$. The layer 13 adjoins the p-n junction 4 and the active laser layer 5 which consists of p-type GaAs, is approximately 0.3 $\mu$m thick and is doped with Ge to a construction of approximately $5 \times 10^{17}$ At/cm$^3$. The active layer 5 adjoins a p-type layer 14 of $Al_xGa_{1-x}As$ having a thickness of approximately 2.2 $\mu$m, in which x is approximately 0.25 and which contains as a doping impurity Ge at a concentration of approximately $5 \times 10^{17}$ At/cm$^3$. The layer 15 consists of p-type GaAs doped with Ge to a concentration of approximately $2 \times 10^{18}$ At/cm$^3$ and has a thickness of approximately 1.4 $\mu$m. Via the aperture 9 a p-type zone 16 is provided in the layer 15 by diffusion of Zn from a $ZnAs_2$ source which contains approximately 10% GaAs at a temperature of approximately 600° C. for approximately 10 minutes. The penetration depth of said zone 16 is approximatey 1 $\mu$m.

The semiconductor body 1 can be manufactured entirely in the usual manner. The overall thickness is approximately 100 $\mu$m.

The semiconductor body 1 of the present laser is further approximately 300 $\mu$m × 300 $\mu$m, the width of the stripe-shaped aperture 9 being approximately 10 $\mu$m. The threshold current which is necessary for the occurrence of stimulated emission was found to be approximately 200 mA in one practical example. Spontaneous emission was observed at one of the mirror side faces with an intensity distribution as shown diagrammatically by the curve 31 in FIG. 3. The maximum occurs substantially below the center of the aperture 9 and the half-width is approximately 20 $\mu$m. The observed spontaneous emission arose substantially entirely in the immediate proximity of the mirror side face in question.

It will be apparent from this observation that upon passage of a current through the semiconductor body below the stripe-shaped aperture whose width is approximately 10 $\mu$m, a much wider stripe-like region is formed in the active layer in which the number of injected charge carriers is sufficiently large to cause observable spontaneous emission. From the stripe-shaped aperture the electric current will spread slightly in a fan-like manner in a lateral direction from the longer sides of the aperture. Furthermore, the charge carriers injected in the active layer 5 and confined between the two hetero junctions, will diffuse laterally as a result of the concentration gradient occurring therein. The width of the stripe-like portion of the active layer in which at the said device current of approximately 200 mA, spontaneous emission occurs with an intensity of at least 0.3 of the maximum observed intensity, is approximately 25 $\mu$m. Thus a considerable increase in the charge carrier concentration will have occurred in said stripe-like portion and it will be probable that upon further increasing the current flowing in said stripe-like portion the amount of inversion required for laser action could soon be attained. It is difficult however to provide an accurate relationship between the occurrence of inversion and the observed intensity of spontaneous emission with a current of the order of the threshold current. A large number of parameters, such as the thickness and doping of the active layer and the adjoining layers play a part. Generally it may be assumed that in those regions where the intensity of the spontaneous emission is less than 0.3 of the maximum intensity, the charge carrier concentration will always be too small for the occurrence of laser action. In many cases laser action will be only possible in a smaller region in which the intensity of the spontaneous emission is not less than half the maximum value. In that case, however, in the present example, a stripe-shaped region approximately 20 $\mu$m wide would still remain in which sufficient inversion can occur. Experience teaches that a lasing region of such a width is much too large to expect the laser to operate in the fundamental transversal mode with a single spot. In practice one or more higher order modes will occur in a stripe laser of the kind hitherto proposed with such a stripe width, and such a laser will have two or more spots. For the occurrence of the fundamental transversal mode the width of a stripe-shaped lasing region will have to be limited to at most 10 $\mu$m and preferably to at most 6 $\mu$m, it being noted that said values are practical values. The exact maximum permissible stripe width will also depend on the doping and the thickness of the active layer.

The width of the stripe-shaped region in the active layer in which spontaneous emission occurs can be reduced by reducing the width of the aperture 9. The aperture 9 determines a smallest cross-section for passage of electric current which has an important influence on the size of the current-carrying part of the p-n junction 4.

With the above stated layer thicknesses and dopings a reduction in the width of the aperture 9 to, for example, 1 $\mu$m would result in the said stripe-like region having a width of 11 to 16 $\mu$m in the active layer in which stimulated emission might occur. Such a width is still too great for the width of the lasing region if only the fundamental transversal mode is to be excited and in addition an aperture of 1 $\mu$m imposes particularly stringent requirements upon the manufacturing process.

Figures 2, 3:
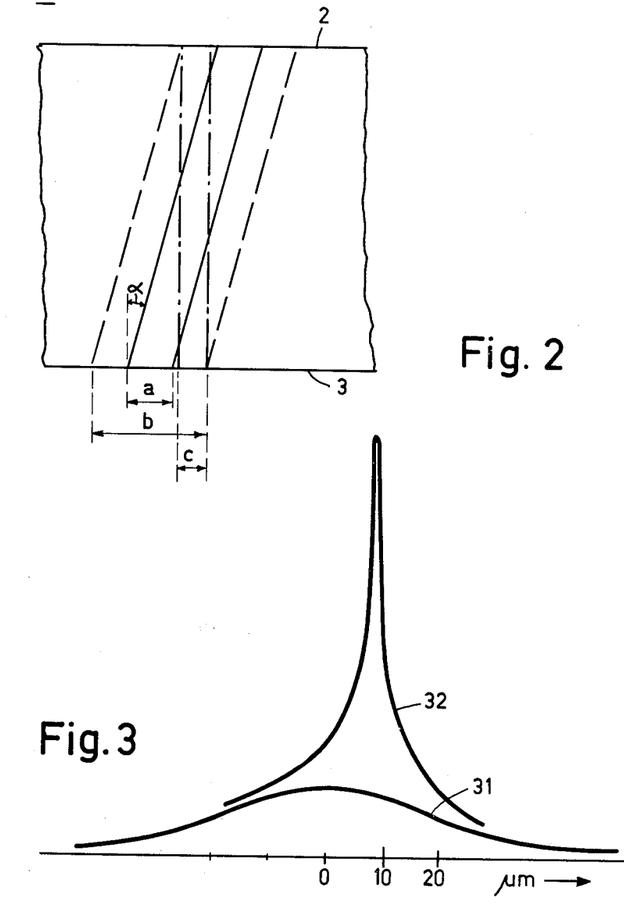
FIG. 2 is a diagrammatic plan view relating to the first embodiment.
FIG. 3 is a graph schematically indicating observed radiation intensities.

In the present embodiment of the invention the aperture 9 is arranged obliquely with respect to the mirror side faces 2 and 3, as is shown diagrammatically in FIG. 2. For clarity, the deviation is exaggerated in this Figure which is not drawn to scale. In practice the width a of the aperture 9 was 10 $\mu$m and the angle $\alpha$ between the normal to the mirror side faces 2 and 3 and the parallel long edges of the aperture 9 was approximately 3.5°.

As already stated, with an aperture 9 of 10 $\mu$m width in the present example, the stripe-like portion in the active layer in which spontaneous emission occurs at the threshold current with an intensity greater than or equal to 0.3 of the maximum intensity, is approximately 25 μm wide. This strips is shown by broken lines in FIG. 2. The distance b is approximately 25 μm. Since the stripe b is oblique with respect to the mirror side faces, the largest rectangular stripe fitting within it is much narrower. This rectangular stripe which is as wide as possible and extends from mirror side face 2 to mirror side face 3 has a width c of approximately 7 μm in the present example. At an angle α of approximately 3.5° and a distance between the mirror side faces of approximately 300 μm, the intersection of the aperture 9 and one mirror side face 2 is laterally displaced by a distance of approximately 18 μm with respect to the intersection of the aperture 9 and the other mirror side face 3.

Upon increasing the current to approximately 320 mA, laser action was observed with an intensity distribution as shown diagrammatically by the curve 32 in FIG. 3. The maximum intensity was approximately 6 times as large as the maximum intensity of the luminescence at the threshold current. The half-width of the spot was approximately 4 μm. The laser beam was shifted approximately 9 μm with respect to the spontaneous emission represented by the curve 31 which relates to radiation generated near one mirror side face.

The invention thus presents a particularly simple and attractive solution to the problem of manufacturing semiconductor stripe lasers which operate in the fundamental transversal mode and have a single narrow spot without increasing the demands imposed on the manufacturing process to extremes. Consequently, the yield of the manufacturing process can be expected to be comparatively high.

The relative widths of the stripe-shaped region in which stimulated emission can occur and of the laser spot can be simply controlled by varying the obliquity of the aperture 9, the length of the laser and/or the width of the aperture 9. In the case of a shorter laser the angle α will be made comparatively large, while in the case of a longer laser said angle will be made comparatively small. The angle α is preferably larger than or equal to 2°.

Figure 4:
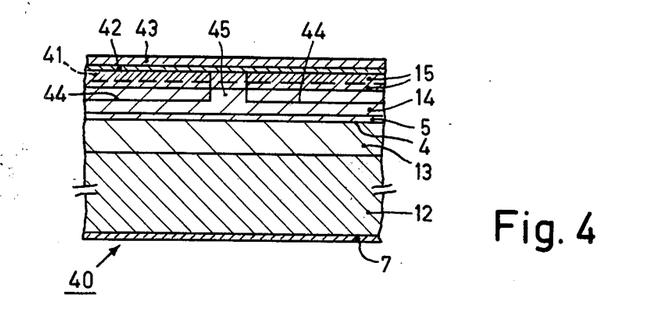
FIG. 4 is a diagrammatic cross-sectional view of a second embodiment.

The second embodiment relates to a proton-bombarded stripe laser. The general construction of the semiconductor body 40 shown in FIG. 4 is similar to that of the first embodiment and comprises layers 12, 13, 14 and 15 having the same thicknesses, compositions and doping impurities and concentrations as hereinbefore described. Instead, however, of a local zone 16, a diffusion of Zn has been carried out in this case throughout the surface of the layer 15. The Zn-doped layer is denoted by 41. A contact member 7 is present as before, on the lower face of the semiconductor body 40, as shown in FIG. 4.

A titanium layer 42, a platinum layer 43 and a gold layer approximately 5 μm thick (not shown) are successively provided on the upper side. The gold layer has subsequently been etched away except for a stripe approximately 4 μm wide extending from one mirror side face to the other. This 4 μm wide gold stripe was used as a mask during a bombardment of the upper surface by protons having an energy of approximately 300 keV. The dose was approximately $10^{15}$ per $cm^2$. As a result of said bombardment, that part of the semiconductor body not masked by the gold stripe becomes high-ohmic down to a depth of approximately 2 μm. The high-ohmic regions present on either side of the gold stripe are indicated in FIG. 4 by their boundaries 44. After bombardment the gold stripe is removed. The semiconductor crystal is then cleaved so as to form the mirror side faces, and the laser body is ready for final assembly. The final assembly can be carried out in a conventional manner and in a conventional envelope. This embodiment has the advantage that the current-path defining cross-section 45 of the contact member 42, 43 situated nearer to the p-n junction 4 is narrower than in the arrangement of FIG. 1 and that in addition, due to the depth of penetration of 2 μm of the proton bombardment, the distance from the current-path defining crossection to the p-n junction 4 is smaller so that the spread of current will be less.

The threshold current in a practical example of this embodiment was found to be approximately 120 mA. The spontaneous emission observed at one of the mirror side faces when employing this current had an intensity distribution with a half-width of approximately 12.5 μm. This distribution is denoted diagrammatically by the curve 51 in FIG. 5.

In this example also the contact member has intentionally been arranged obliquely with respect to the mirror side faces. This arrangement may also be represented by the diagrammatic plan view of FIG. 2 provided that it is assumed that the solid lines spaced a apart and representing the aperture 9 in the insulating layer 8, now represent the stripe-shaped semiconductor region 45, which in this second example actually determines the current-path defining cross-section of the contact member. In the second example the distance a is approximately 4 μm, the distance b is approximately 12.5 μm and the distance c is approximately 7.5 μm. The laser has a length of approximately 300 μm and the intersection of the stripe-like semiconductor region 45 with one mirror side face is shifted approximately 5 μm with respect to that with the other mirror side face. The angle α is about 1° and the difference between the distances b and c is approximately one sixtieth part of the laser length.

Figure 5:
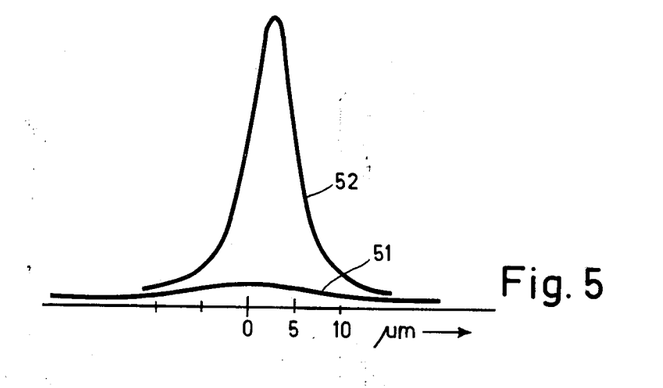
FIG. 5 is a graph schematically indicating radiation intensities observed during operation of the second embodiment.

At a current of approximately 160 mA, laser radiation denoted diagrammatically by the curve 52 was observed. The half-width was about 5 μm and the maximum intensity was approximately 15 times greater than that of the spontaneous emission represented by the curve 51. The site on the mirror side face where said maximum intensity occurs is shifted approximately 2 to 3 μm with respect to the site of the maximum intensity of the observed spontaneous emission.

In the two examples the semiconductor bodies 1 and 40 have a semiconductor substrate 12 which is situated between the p-n junction 4 and the second contact member 7, the p-n junction 4 and the active layer 5 extending laterally in a direction parallel to the mirror side faces 2 and 3 substantially throughout the width of the semiconductor substrate.

In a direction transverse to the first contact member the p-n junction and the active layer are thus clearly wider than the current-carrying portions thereof. In other words, except at the mirror side faces, the lateral boundaries of the lasing region do not coincide with the lateral boundaries of the p-n junction and the active layer. The problems which may arise when the boundary of the p-n junction and the active layer coincide with the boundary of the lasing region, for example too great a change in index of refraction at the edge of the lasing region and/or too high a recombination rate at said edge or energy loss by radiationless recombination at said edge, are avoided in this manner while the lasing region can nevertheless be kept comparatively narrow by employing the invention.

In the first example the first contact member comprises an electrode 6 of conductive material which is separated from the semiconductor laser body by a barrier layer 8 and which is connected electrically to the laser body in a stripe-shaped aperture 9 in the barrier layer 8. The width of the stripe-shaped aperture 9 is preferably at least approximately 5 μm.

In both examples the geometry of the first contact member is chosen to be such that the projections of the intersections of the current-path defining cross-section of aperture 9 and 45, respectively, and the two mirror side faces 2 and 3, respectively, on to a plane parallel to the mirror side faces do not overlap or touch each other in a direction parallel to the p-n junction 4. In the first example the distance between the projections is approximately 8 μm and in the second example said distance is approximately 1 μm.

The widest rectangular stripe region which fits within a stripe region in which luminescence occurs with an intensity greater than or equal to half the maximum intensity of spontaneous emission, is preferably not wider than 6 μm as in the first example in which said width is approximately 20−18=2 μm. A greater certainty of the occurrence of the fundamental transversal mode is present if the widest rectangular stripe-like region extending perpendicularly from one mirror surface to the other which can fit within the luminescent stripe-like region in which the intensity is larger than or equal to 0.3 of the maximum intensity, is also at most 6 μm wide. As stated, the width of said rectangular stripe-like region can be simply adjusted to the desired value by varying the length of the laser, the value of the angle α and/or the width of the current-path defining cross-section of the first contact member. For example, the width of the aperture 9 in the first example may be chosen to be 1 or 2 μm smaller or the laser may be given a length of approximately 330 μm instead of 300 μm.

Figures 6, 7A:
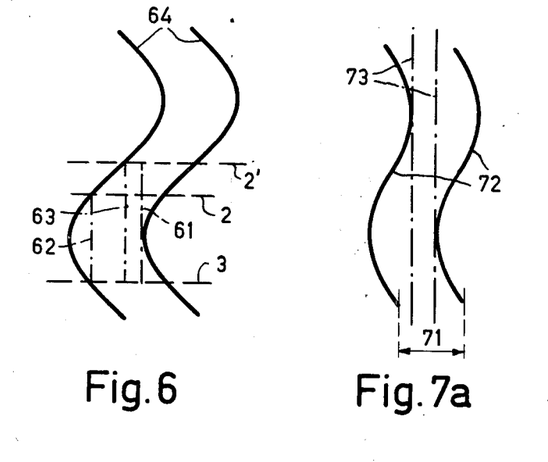
FIGS. 6, 7a and 8a and 9a are plan views of the respective stripe-shaped luminescent region of others lasers embodying the invention.

The present invention is not intended to be restricted to the embodiments described. It will be apparent that other semiconductor materials and/or other layer thicknesses, doping impurites and doping concentrations and/or another construction of the layers may be used. For example, the laser need not be a laser having a double hetero junction. The main object of the invention is to provide lasers which can be manufactured without imposing stringent requirements upon the manufacturing process and which nevertheless operate in the fundamental transversal mode and which, if desired, give a narrow spot. According to the invention this is achieved by selecting the geometry of at least one of the contact members, the geometry in this connection including both the specific shape and the disposition of the contact member with respect to the mirror side faces. A selected geometry embodying the invention enables the region in which spontaneous emission occurs to be made comparatively large while the region in which inversion occurs to a sufficient extent throughout the length of the laser to give rise to laser action is confined to a comparatively narrow rectangular stripe-like region extending from one the mirror side face to the other. Instead of to the simple stripe-like regions having two straight long substantially parallel edges shown in the two examples hereinbefore described, different alternative embodiments may employ other shapes. FIG. 6, for example, shows an embodiment employing a meandering stripe-like region 64 in which spontaneous emission occurs and which can be provided by a contact member with a correspondingly meandering current-path defining cross-section. In the case shown the amplitude of the meander is so large that a laser can only be formed having a length which is less than half cycle of the periodically meandering pattern. Dependent on the length of the laser, the lasing region may be made narrower or wider, as is shown in FIG. 6. The locations of the mirror side faces are shown diagrammatically by broken lines 3, 2 and 2′, respectively, 2 and 2′ being alternative locations. When the mirror side face is located at the line 2, the lasing region lies within the dot-and-dash lines 61 and 62. When the laser is made longer and the respective mirror side face is situated near the line 2′, the lasing region lies within the dot-and-dash lines 61 and 63.

Figure 7B:
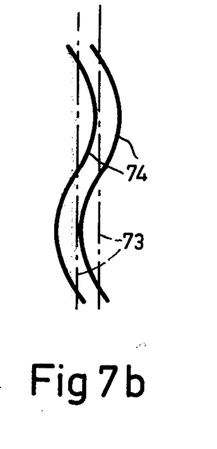
FIGS. 7b, 8b, 9b and 9c are diagrammatic plan views of the corresponding current-path defining cross-sections of stripe-shaped contact members employed to provide the respective stripe-shaped luminescent regions shown in FIG. 7a and FIGS. 8a and 9a, and FIG. 10 is a diagrammatic plan view of a portion of a semiconductor crystal slice from which several lasers embodying the invention can be obtained.

FIG. 7a shows that the combination of stripe width 71 and amplitude of the meander may also be chosen to be such that, for laser lengths exceeding half a cycle of the meander period, the width of the lasing region is independent of the length of the laser. The meandering luminescent stripe-shaped luminescent region 72 includes a rectangular stripe-shaped region 73 the width of which is independent of length. Dependent on the amount of current spreading which occurs, and the diffusion length of the enclosed charge carriers, the narrower stripe 74 shown in FIG. 7b and which represents the corresponding current-path defining cross-section of the contact member, may not include a continuous rectangular stripe at all.

Figure 8A:
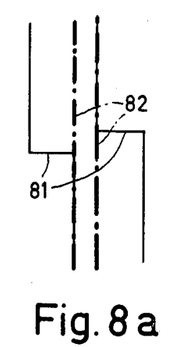
Figure 8B:
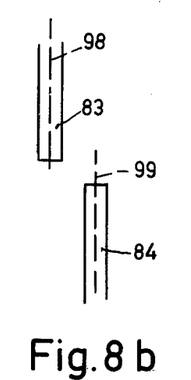
Figure 9A:
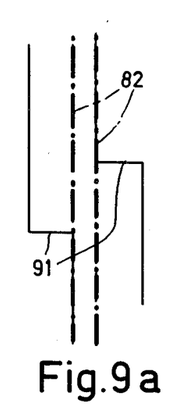
Figure 9B:
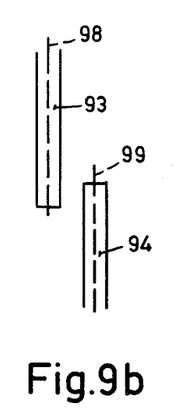
Figure 9C:
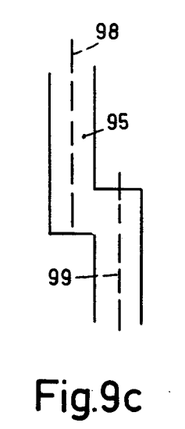

Another configuration, in which the width of the lasing region can be independent of the length of the laser, is shown in FIG. 8. FIG. 8a shows the corresponding stripe-shaped region of luminescence 81 with therein the continuous rectangular stripe 82 in which laser action may occur. The stripe 81 which is locally staggered laterally, can be provided by a contact member comprising two parts 83 and 84 as shown in FIG. 8b. In the case of a contact member having parts which are separated from each other, the parts will preferably have a collective length which is greater than the length of the laser so that the two parts slightly overlap each other in the longitudinal direction of the laser. Such a variation is shown in FIG. 9. FIG. 9a shows the stripe-shaped luminescent region 91 and the straight boundary 82 of the lasing region and FIG. 9b shows the two parts 93 and 94 of the contact member separated from each other. In the case in which the difference between the width of the luminescent stripe 91 and that of the current-path defining cross-section is smaller, for example because less current spreading occurs, a continuous contact member 95 (FIG. 9c) may be used.

FIGS. 8 and 9 demonstrate that the distance b between the longitudinal side boundaries of the luminescent stripe 81, 91 may vary along the normal to mirror side faces. In this case, involving staggered rectangles, the relevant distance b apparently is the distance b associated with the rectangles as such and not the distance measured in the area where the rectangles join each other. In general, the relevant value of distance b is the value determined by the smallest dimension of the contact member in question, i.e. the dimension which, without employing the invention, would have determined the width of the lasing stripe region.

Figure 10:
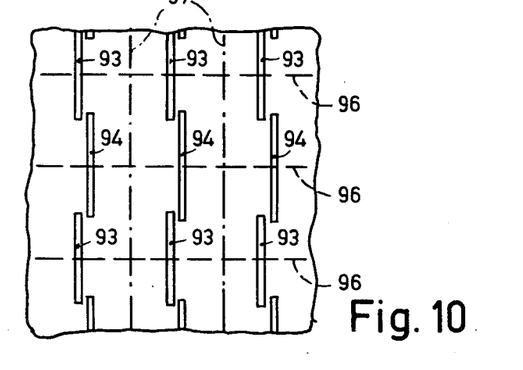

The shapes shown in FIGS. 8 and 9 have the advantage as compared with those shown in FIGS. 6 and 7 that only straight lines occur therein. These shapes, which are constructed from rectangles, are simpler to realize in the form of exposure masks which are necessary for the photolithographic steps in the manufacturing process. Moreover, said rectangular shapes which extend substantially at right angles to the mirror side faces can be aligned more readily with respect to the crystal cleavage plane to be used as mirror side faces. Several series of staggered apertures 93 and 94 (FIG. 10) can be provided in an insulating layer of, for example, silicon oxide in a comparatively simple manner by means of a photochemical etching process. The whole free surface may then be covered with a conductive layer. From a semiconductor body processed in this manner a number of lasers can be obtained by cleaving the body transversely to and across the apertures in such manner that each laser includes at least portions of two apertures 93 and 94. Cleaving may be carried out, for example, along the broken lines 96. In a direction parallel to the series of apertures the semiconductor body may be severed into a number of straight stripes, for example by scratching and breaking, for example, along the dot-and-dash lines 97. Severing into straight stripes extending substantially at right angles to the mirrors, i.e. at right angles to the lines 96, is simpler than severing into stripes extending at an angle to the mirrors.

For proton-bombarded lasers, staggered stripes of masking material can be etched out in a similar manner.

In general this important preferred embodiment is characterized in that the current-path defining cross-section associated with the first contact member has at least two substantially rectangular portions extending substantially at right angles to the mirror side faces and each having a length which is smaller than the distance between the mirror side faces, the center lines 98 and 99, respectively, of said two rectangular portions extending substantially parallel to each other and not coinciding with each other but being situated at some distance and separated one from the other. The sum of the lengths of the rectangular portions is preferably at least equal to the distance between the mirror side faces, said sum being advantageously chosen to be larger than the said distance. The distance between the center lines 98 and 99 is of the order of magnitude of the width of the rectangular portions of the current-path defining cross-section of the contact member measured transversely to the center lines and, dependent on the amount of current spread which occurs and lateral diffusion of injected charge carriers, will be slightly greater than said width as is shown in FIGS. 8b and 9b, or will be equal to said width as is shown in FIG. 9c or will be slightly smaller than said width. In the two latter cases the rectangular parts will overlap each other locally or at least adjoin each other.

What is claimed is:

1. A semiconductor laser comprising:
   a first layer of an N-type semiconductor material;
   a second layer of P-type semiconductor material, said N-type and P-type layers forming a P-N junction in said laser;
   means for injecting charge carriers across said P-N junction to induce charge recombination and emission of optical radiation;
   a pair of mirrored faces perpendicular to said P-N junction; and
   a stripe region adapted to laterally confine charge carrier flow across said P-N junction to a region which is substantially within the lateral boundaries of said stripe region, said stripe region being oriented at a non-zero angle with respect to an axis extending normally between said mirrored faces.

2. An injection laser comprising a semiconductor body having two substantially parallel side faces forming the mirrors of the laser, said semiconductor body comprising a p-n junction extending transversely to the mirror side faces and an active laser layer adjacent said p-n junction, and a contact member disposed on each side of the p-n junction and spaced therefrom, said contact members each bridging the distance between the mirror side faces substantially entirely, a first of said contact members being situated closer to said p-n junction than a second and forming an effective stripe-shaped conductive contact region with said body, said effective stripe-shaped conductive contact region extending nonorthogonally to said mirror side faces, a portion of the p-n junction, at which spontaneous luminescence occurs when a current approximately equal to the threshold current necessary for the occurrence of simulated emission is passed from one of said contact members to the other through said effective stripe-shaped conductive contact region and the semiconductor body, having a stripe shape and extending from one mirror side face to the other, the geometry of the effective stripe-shaped conductive contact region of said first contact member being such that a rectangular stripe-shaped region extending orthogonally from one said mirror side face to the other can be accomodated in the stripe-shaped portion of the p-n junction whose longitudinal side boundaries are spaced at a distance from each other measured parallel to said mirror side faces, said boundary spacing distance being such that the local intensity of the spontaneous emission occurring between said longitudinal side boundaries is at least approximately three-tenths of the maximum value of the local intensity of said spontaneous emission, the width of said rectangular stripe-shaped region being at most equal to said boundary spacing distance minus one-sixtieth part of the distance between the mirror side faces and being such that in operation a single laser beam is generated by said injection laser.

3. An injection laser as claimed in claim 2, wherein the width of said rectangular stripe-shaped region is at most equal to about 6 μm.

4. An injection laser as claimed in claim 2, wherein the semiconductor body comprises a semiconductor substrate extending between the p-n junction and the second contact member, the p-n junction and the active layer extending laterally substantially throughout the width of the semiconductor substrate in a direction parallel to the mirror side faces.

5. An injection laser as claimed in claim 4, wherein the first contact member comprises an electrode of a conductive material which is separated from the semiconductor laser body by a barrier layer and is connected electrically to the laser body in a stripe-shaped aperture in the barrier layer to form the stripe-shaped conductive contact region, the width of said stripe-shaped aperture being at least approximately 5 μm.

6. An injection laser as claimed in claim 5, wherein said stripe-shaped aperture has two substantially parallel straight sides extending substantially from one mirror side face to the other and inclined at an angle of at least 1° to the normal with respect to both said mirror side faces.

7. An injection laser as claimed in claim 6, wherein the perpendicular projections of the respective ends of said stripe-shaped aperture situated near the corresponding mirror side faces, on a plane parallel to the mirror side faces, do not overlap or touch each other in a direction parallel to the plane of the p-n junction.

8. An injection laser comprising a semiconductor body having two substantially parallel side faces forming the mirrors of the laser, said semiconductor body comprising a p-n junction extending transversely to the mirror side faces and an active laser layer adjacent said p-n junction, and a contact member disposed on each side of the p-n junction and spaced therefrom, each said contact member bridging the distance between the mirror side faces substantially entirely, a first of said contact members being situated closer to said p-n junction than a second and forming an effective stripe-shaped conductive contact region with said body extending between said mirror side faces, said conductive contact region having substantially parallel straight sides which are inclined at an angle of at least about one degree from the normal with respect to said mirror side faces.

9. An injection laser comprising a semiconductor body having two substantially parallel side faces forming the mirrors of the laser, said semiconductor body comprising a p-n junction extending transversely to the mirror side faces and an active laser layer adjacent said p-n junction, and a contact member disposed on each side of the p-n junction and spaced therefrom, each said contact member bridging the distance between the mirror side faces substantially entirely, a first of said contact members being situated closer to said p-n junction than a second and forming an effective stripe-shaped conductive contact region with said body extending between said mirror side faces, said first contact member comprising two substantially parallel offset rectangular conductive portions each extending from one of said mirror faces perpendicular thereto and each having a length which is smaller than the distance between said mirror faces.

10. An injection laser as in claim 9, wherein the length of each said rectangular conductive portion is less than half of the distance between said mirror faces.

11. An injection laser as in claim 9, wherein the length of each said rectangular conductive portion is greater than half of the distance between said mirror faces.

12. An injection laser comprising a semiconductor body having two substantially parallel side faces forming the mirrors of the laser, said semiconductor body comprising a p-n junction extending transversely to the mirror side faces and an active laser layer adjacent said p-n junction, and a contact member disposed on each side of the p-n junction and spaced therefrom, each said contact member bridging the distance between the mirror side faces substantially entirely, a first of said contact members being situated closer to said p-n junction than a second and forming an effective stripe-shaped conductive contact region with said body extending between said mirror side faces, said first contact member comprising an arcuate conductive portion having parallel sides.

13. An injection laser comprising a semiconductor body having two substantially parallel side faces forming the mirrors of the laser, said semiconductor body comprising a p-n junction extending transversely to the mirror side faces and an active laser layer adjacent said p-n junction, a contact member disposed on each side of the p-n junction and spaced therefrom, said contact members each bridging the distance between the mirror side faces substantially entirely, a first of said contact members being situated closer to said p-n junction than a second and forming an effective stripe-shaped conductive contact region with said body, a portion of the p-n junction, at which spontaneous luminescence occurs when a current approximately equal to the threshold current necessary for the occurrence of simulated emission is passed from one of said contact members to the other through said effective stripe-shaped conductive contact region and the semiconductor body, having a stripe shape and extending from one mirror side face to the other, the geometry of the effective stripe-shaped conductive contact region of said first contact member being such that a rectangular stripe-shaped region extending transversely from one said mirror side face to the other can be accomodated in the stripe-shaped portion of the p-n junction whose longitudinal side boundaries are spaced at a distance from each other measured parallel to said mirror side faces, said boundary spacing distance being such that the local intensity of the spontaneous emission occurring between said longitudinal side boundaries is at least approximately three-tenths of the maximum value of the local intensity of said spontaneous emission, the width of said rectangular transverse stripe-shaped region being at most equal to said boundary spacing distance minus one-sixtieth part of the distance between the mirror side faces and being such that in operation a single laser beam is generated by said injection laser, and means associated with the first contact member for producing a current-path defining cross-section and having at least two substantially rectangular portions each extending substantially at right angles to the mirror faces and each having a length which is smaller than the distance between said mirror side faces, the center lines of said rectangular portions being spaced apart and extending substantially parallel to each other.

14. An injection laser comprising a semiconductor body having two substantially parallel side faces forming the mirrors of the laser, said semiconductor body comprising a p-n junction extending transversely to the mirror side faces, an active laser layer situated near said p-n junction, and a contact member disposed on each side of the p-n junction and spaced therefrom, said contact members each bridging the distance between the mirror side faces substantially entirely, a first of said contact members being situated closer to said p-n junction than the second and defining an effective stripe-shaped conductive contact region of said body, said conductive contact region of said body extending between said mirror side faces and having substantially parallel and substantially straight sides which are inclined at an angle from the normal with respect to said mirror side faces, said first contact member and said stripe-shaped conductive contact region each having respective ends situated near the respective mirror side faces, at least one of the group of perpendicular projections of said respective ends of said first contact member and the group of perpendicular projections of said respective ends of said stripe-shaped contact region on a plane parallel to the mirror side faces being separate from each other and non-overlapping due to said inclination at an angle of said parallel and straight sides.

15. An injection laser comprising a semiconductor body having two substantially parallel side faces forming the mirrors of the laser, said semiconductor body comprising a p-n junction extending transversely to the mirror side faces, an active laser layer situated near said p-n junction, and a contact member disposed on each side of the p-n junction and spaced therefrom, said contact members each bridging the distance between the mirror side faces substantially entirely, a first of said contact members being situated closer to said p-n junction than the second and having at least two substantially rectangular portions each extending substantially at right angles to the mirror sides faces and each having a length which is smaller than the distance between said mirror side faces, the center lines of said at least two rectangular portions being spaced apart and extending substantially parallel to each other.

16. An injection laser comprising a semiconductor body having two substantially parallel side faces forming the mirrors of the laser, said semiconductor body comprising a p-n junction extending transversely to the mirror side faces, an active laser layer situated near said p-n junction, and a contact member disposed on each side of the p-n junction and spaced therefrom, said contact members each bridging the distance between the mirror side faces substantially entirely, a first of said contact members being situated closer to said p-n junction than the second and defining a stripe-shaped contact region of the body, said stripe-shaped contact region having two longitudinal sides which substantially extend from a first of said mirror side faces to the second mirror side face and comprising an arcuate portion in which the longitudinal sides extend substantially parallel to each other.

17. An injection laser as claimed in claim 16, wherein said longitudinal sides of said stripe-shaped contact region extend substantially parallel to each other along substantially the entire distance between the mirror side faces.

* * * * *